(12) United States Patent
Velichko et al.

(10) Patent No.: US 9,761,624 B2
(45) Date of Patent: Sep. 12, 2017

(54) PIXELS FOR HIGH PERFORMANCE IMAGE SENSOR

(71) Applicant: SEMICONDUCTOR COMPONENTS INDUSTRIES, LLC, Phoenix, AZ (US)

(72) Inventors: Sergey Velichko, Boise, ID (US); Victor Lenchenkov, Sunnyvale, CA (US); Irfan Rahim, Milpitas, CA (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 2 days.

(21) Appl. No.: 15/174,396

(22) Filed: Jun. 6, 2016

(65) Prior Publication Data

US 2017/0229496 A1 Aug. 10, 2017

Related U.S. Application Data

(60) Provisional application No. 62/292,925, filed on Feb. 9, 2016.

(51) Int. Cl.
*H01L 27/00* (2006.01)
*H01L 27/146* (2006.01)

(52) U.S. Cl.
CPC ...... *H01L 27/1464* (2013.01); *H01L 27/1463* (2013.01); *H01L 27/14627* (2013.01); *H01L 27/14629* (2013.01); *H01L 27/14643* (2013.01); *H01L 27/14689* (2013.01)

(58) Field of Classification Search
CPC .................................................. H01L 27/1474
See application file for complete search history.

(56) References Cited

U.S. PATENT DOCUMENTS

| | | | |
|---|---|---|---|
| 5,008,758 | A | 4/1991 | Burke |
| 7,662,657 | B2 | 2/2010 | Mouli |
| 8,390,089 | B2 | 3/2013 | Chen et al. |
| 8,471,312 | B2 | 6/2013 | Kudoh |
| 8,872,953 | B2 | 10/2014 | Sakano et al. |
| 8,946,611 | B2 | 2/2015 | Iwata |
| 9,160,949 | B2 | 10/2015 | Zhang et al. |
| 2005/0184353 | A1 | 8/2005 | Mouli |
| 2006/0180885 | A1 | 8/2006 | Rhodes |

(Continued)

OTHER PUBLICATIONS

Hong, U.S. Appl. No. 14/877,722, filed Oct. 7, 2015.
Velichko et al., U.S. Appl. No. 14/836,599, filed Aug. 26, 2015.

*Primary Examiner* — William Harriston
(74) *Attorney, Agent, or Firm* — Treyz Law Group, P.C.; Joseph F. Guihan (57) ABSTRACT

Visual and near infrared pixels may have deep photodiodes to ensure sufficient capture of light. The pixels may have a silicon layer that is etched to form a microlens for the pixel. The pixels may include an inversion layer formed over the silicon layer to prevent dark current. Additionally, the pixels may include a conductive layer formed over the inversion layer that further prevents dark current. The conductive layer may be coupled to a bias voltage supply line. The conductive layer may be biased during image acquisition to prevent dark current. During readout, the bias voltage may be pulsed at a lower voltage to ensure all of the collected charge is transferred out of the photodiode during charge transfer.

17 Claims, 9 Drawing Sheets

(56) References Cited

U.S. PATENT DOCUMENTS

| | | |
|---|---|---|
| 2006/0267054 A1* | 11/2006 | Martin ............. H01L 27/14632 257/291 |
| 2007/0194357 A1* | 8/2007 | Oohashi ................ H01L 31/108 257/292 |
| 2009/0140304 A1 | 6/2009 | Kudoh |
| 2011/0147884 A1 | 6/2011 | Van Noort et al. |
| 2012/0025060 A1 | 2/2012 | Iwata |
| 2012/0189293 A1 | 7/2012 | Cao et al. |
| 2013/0049082 A1 | 2/2013 | Kato et al. |
| 2013/0308008 A1 | 11/2013 | Funatsu et al. |
| 2014/0291481 A1 | 10/2014 | Zhang et al. |
| 2015/0048427 A1 | 2/2015 | Hu et al. |
| 2016/0141317 A1 | 5/2016 | Tekleab |
| 2016/0190200 A1 | 6/2016 | Shinohara |

\* cited by examiner

PIXELS FOR HIGH PERFORMANCE IMAGE SENSOR

CROSS-REFERENCE TO RELATED APPLICATION(S)

This application claims priority to U.S. Provisional Application No. 62/292,925, filed on Feb. 9, 2016, entitled "Pixels for High Performance Image Sensor," invented by Sergey Velichko, Victor Lenchenkov and Irfan Rahim, and is incorporated herein by reference and priority thereto for common subject matter is hereby claimed.

BACKGROUND

This relates generally to imaging systems and, more particularly, to imaging systems with high performance pixels.

Modern electronic devices such as cellular telephones, cameras, and computers often use digital image sensors. Imager sensors (sometimes referred to as imagers) may be formed from a two-dimensional array of image sensing pixels. Each pixel includes a photosensitive layer that receives incident photons (light) and converts the photons into electrical charge. Image sensors are sometimes designed to provide images to electronic devices using a Joint Photographic Experts Group (JPEG) format.

In certain applications, pixels may be used to sense both visual and near infrared (NIR) light. However, NIR light may travel deep into the photosensitive layer before being converted into electrical charge. Therefore, in these applications it is desirable for photon-generated charge absorption in a pixel to be as deep as possible. Conventional methods of forming photosensitive layers include implanting ions into semiconductor material. However, there is a limit to how deep ions may be implanted. Ion implantation may therefore not produce photosensitive layers optimal for near infrared light sensing.

It would therefore be desirable to provide improved pixels for improved sensing of both visual and near infrared light.

DETAILED DESCRIPTION

Embodiments of the present invention relate to image sensors with pixels. The image sensors may be image sensors with pixels that sense both visual and near infrared light. The pixels may have deep photodiodes to ensure sufficient capture of both visual and near infrared light. The pixels may include an inversion layer to prevent dark current and a conductive layer formed over the inversion layer that further prevents dark current. The conductive layer may also be biased during acquisition to minimize dark current and biased differently during readout to ensure all of the collected charge is transferred out of the photodiode during charge transfer.

Figure 1:
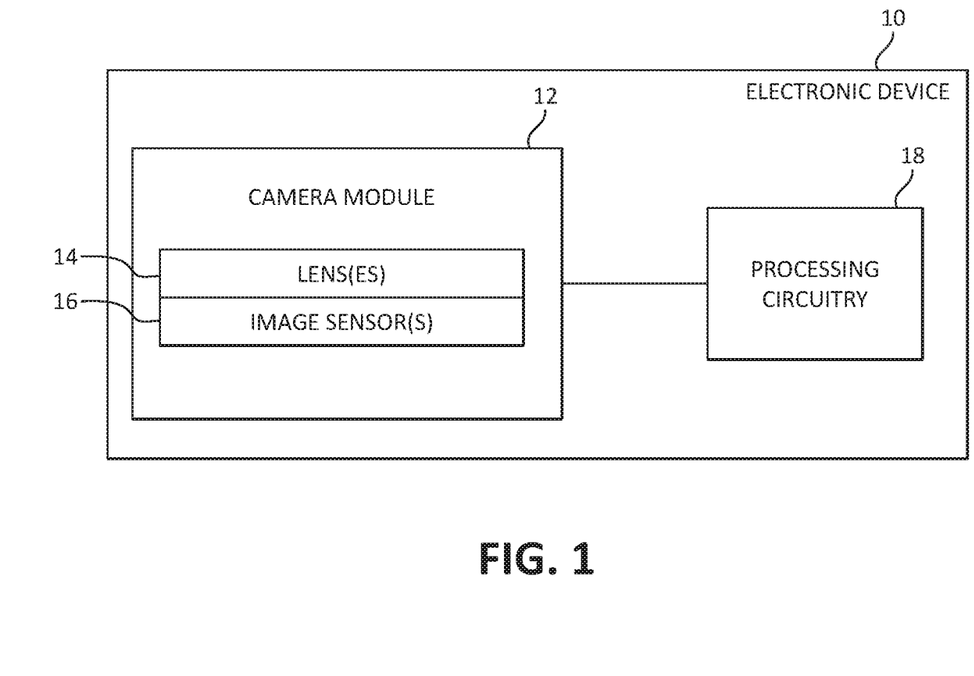
FIG. 1 is a schematic diagram of an illustrative electronic device that may include an image sensor in accordance with an embodiment of the present invention.

An illustrative electronic device that may include these pixels is shown in FIG. 1. Electronic device 10 may be a digital camera, a computer, a cellular telephone, a medical device, or other electronic device. Camera module 12 (sometimes referred to as an imaging device) may include image sensor 16 and one or more lenses 14. During operation, lenses 14 focus light onto image sensor 16. Image sensor 16 includes photosensitive elements (e.g., pixels) that convert the light into digital data. Image sensors may have any number of pixels (e.g., hundreds, thousands, millions, or more). A typical image sensor may, for example, have millions of pixels (e.g., megapixels). As examples, image sensor 16 may include bias circuitry (e.g., source follower load circuits), sample and hold circuitry, correlated double sampling (CDS) circuitry, amplifier circuitry, analog-to-digital (ADC) converter circuitry, data output circuitry, memory (e.g., buffer circuitry), address circuitry, etc.

Still and video image data from image sensor 16 may be provided to processing circuitry 18. Processing circuitry 18 may be used to perform image processing functions such as automatic focusing functions, depth sensing, data formatting, adjusting white balance and exposure, implementing video image stabilization, face detection, etc.

Processing circuitry 18 may also be used to compress raw camera image files if desired (e.g., to Joint Photographic Experts Group or JPEG format). In a typical arrangement, which is sometimes referred to as a system on chip (SOC) arrangement, image sensor 16 and processing circuitry 18 are implemented on a common integrated circuit. The use of a single integrated circuit to implement image sensor 16 and processing circuitry 18 can help to reduce costs. This is, however, merely illustrative. If desired, image sensor 16 and processing circuitry 18 may be implemented using separate integrated circuits. Processing circuitry 18 may include microprocessors, microcontrollers, digital signal processors, application specific integrated circuits, or other processing circuits.

Figure 2:
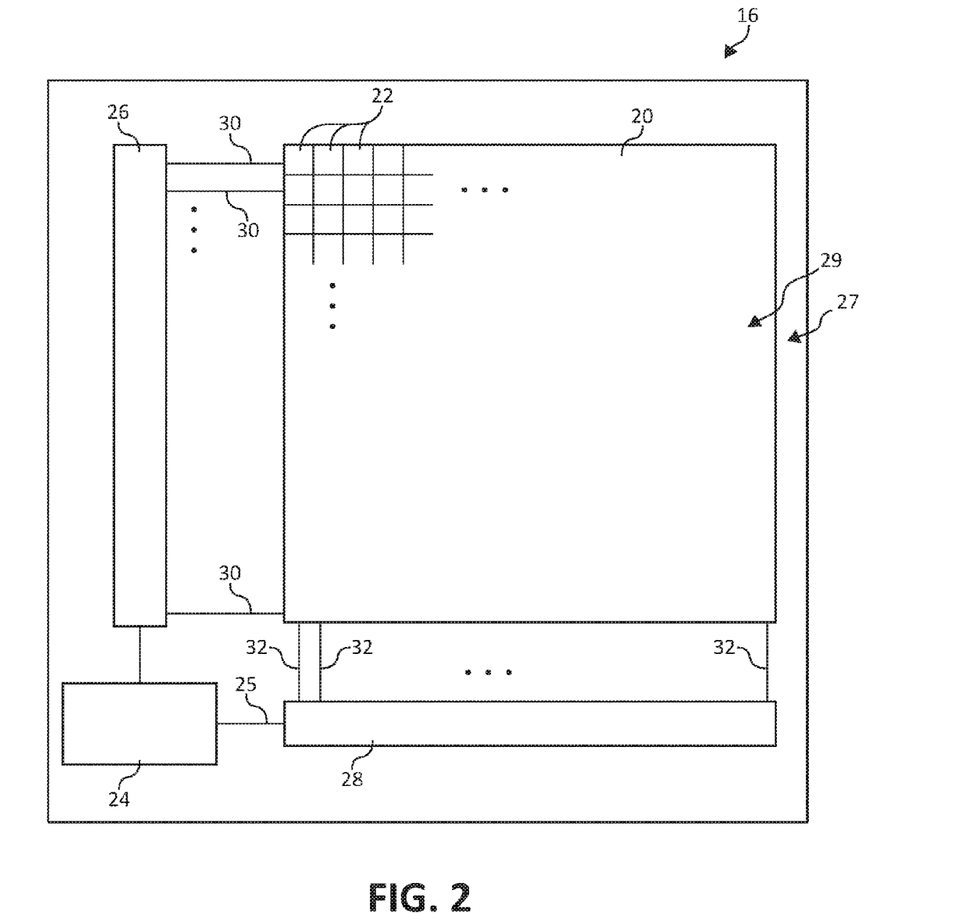
FIG. 2 is a diagram of an illustrative pixel array and associated readout circuitry for reading out image signals from the pixel array in accordance with an embodiment of the present invention.

As shown in FIG. 2, image sensor 16 may include pixel array 20 containing image sensor pixels 22 arranged in rows and columns (sometimes referred to herein as image pixels or pixels) and control and processing circuitry 24 (which may include, for example, image signal processing circuitry). Array 20 may contain, for example, hundreds or thousands of rows and columns of image sensor pixels 22.

Control circuitry 24 may be coupled to row control circuitry 26 and image readout circuitry 28 (sometimes referred to as column control circuitry, readout circuitry, processing circuitry, or column decoder circuitry).

Row control circuitry 26 may receive row addresses from control circuitry 24 and supply corresponding row control signals such as reset, row-select, charge transfer, dual conversion gain, and readout control signals to pixels 22 over row control paths 30. One or more conductive lines such as column lines 32 may be coupled to each column of pixels 22 in array 20. Column lines 32 may be used for reading out image signals from pixels 22 and for supplying bias signals (e.g., bias currents or bias voltages) to pixels 22. If desired, during pixel readout operations, a pixel row in array 20 may be selected using row control circuitry 26 and image signals generated by image pixels 22 in that pixel row can be read out along column lines 32.

Image readout circuitry 28 may receive image signals (e.g., analog pixel values generated by pixels 22) over column lines 32. Image readout circuitry 28 may include sample-and-hold circuitry for sampling and temporarily storing image signals read out from array 20, amplifier circuitry, analog-to-digital conversion (ADC) circuitry, bias circuitry, column memory, latch circuitry for selectively enabling or disabling the column circuitry, or other circuitry that is coupled to one or more columns of pixels in array 20 for operating pixels 22 and for reading out image signals from pixels 22. ADC circuitry in readout circuitry 28 may convert analog pixel values received from array 20 into corresponding digital pixel values (sometimes referred to as digital image data or digital pixel data). Image readout circuitry 28 may supply digital pixel data to control and processing circuitry 24 and/or processor 18 (FIG. 1) over path 25 for pixels in one or more pixel columns.

Figure 3:
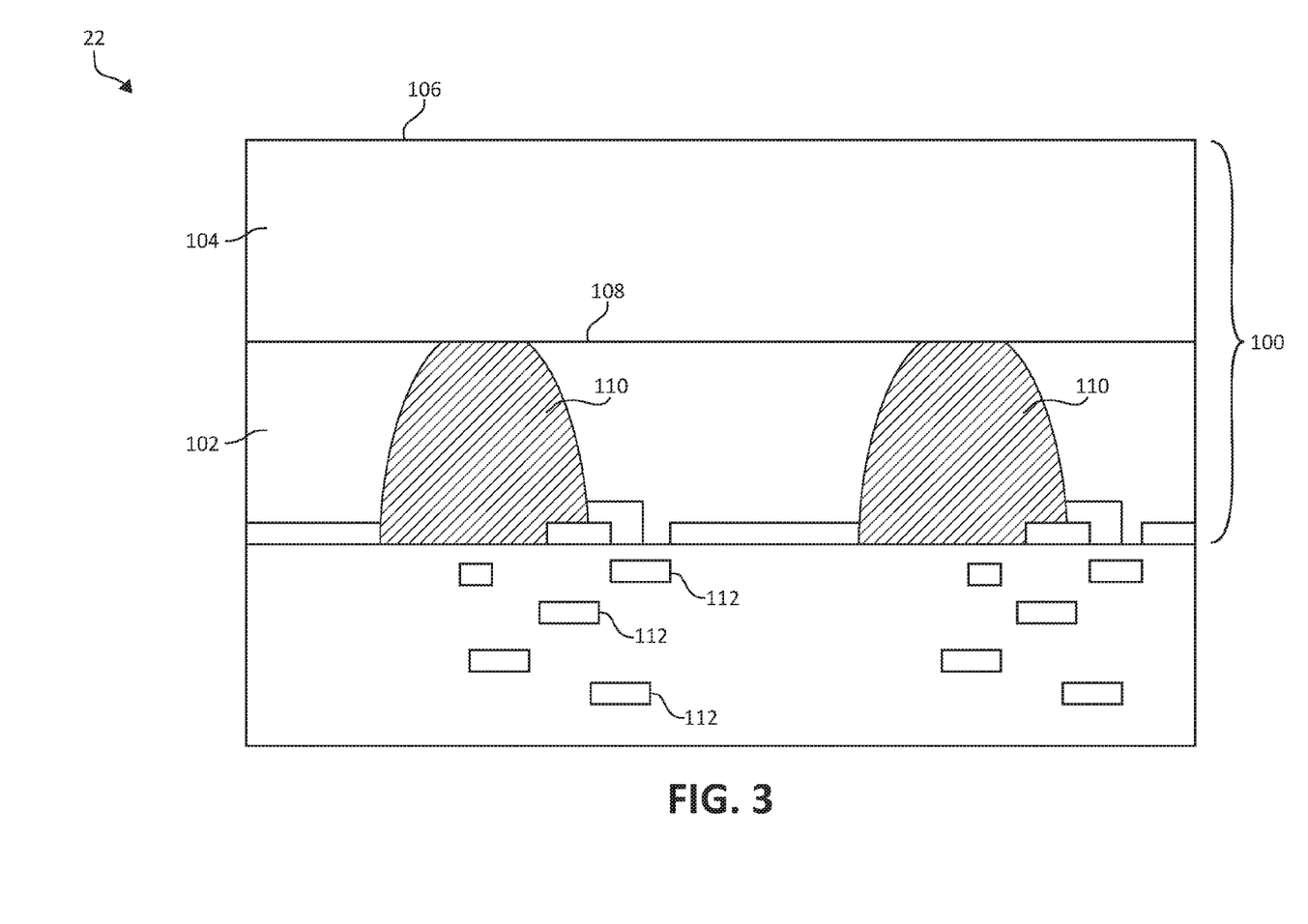
FIG. 3 is a cross-sectional side view of an illustrative imaging pixel with isolation regions in accordance with an embodiment of the present invention.

In certain applications, pixels 22 may be used to sense both visual and near infrared (NIR) light. In these applications, it is desirable for the photodiodes of pixels 22 to be as deep as possible. FIG. 3 is a cross-sectional side view of an illustrative pixel during pixel formation. To form pixels with a deep photodiode, a substrate such as substrate 100 in FIG. 3 may be provided. Substrate 100 may be a p-type doped silicon substrate. Substrate 100 may have an n-implanted region 102. The n-implanted region may be doped with any desired n-type dopants via ion implantation. Additionally, a layer of epitaxial silicon 104 may be formed on n-implanted region 102. Epitaxial silicon 104 may be graded epitaxial silicon with a doping profile optimized for pixel performance. In one illustrative example, graded epitaxial silicon 104 may have a doping concentration at upper surface 106 different from a doping concentration at lower surface 108. The doping concentration may gradually change from the upper surface towards the lower surface.

N-implanted region 102 may have p-type doped isolation regions 110 that help isolate adjacent pixels from each other. The p-type doped isolation regions may be formed by implanting p-type dopants into layer 102. Pixel 22 may also include various transistors and signal metal routing lines such as trunk transistors and corresponding metal routing lines 112.

Figure 4:
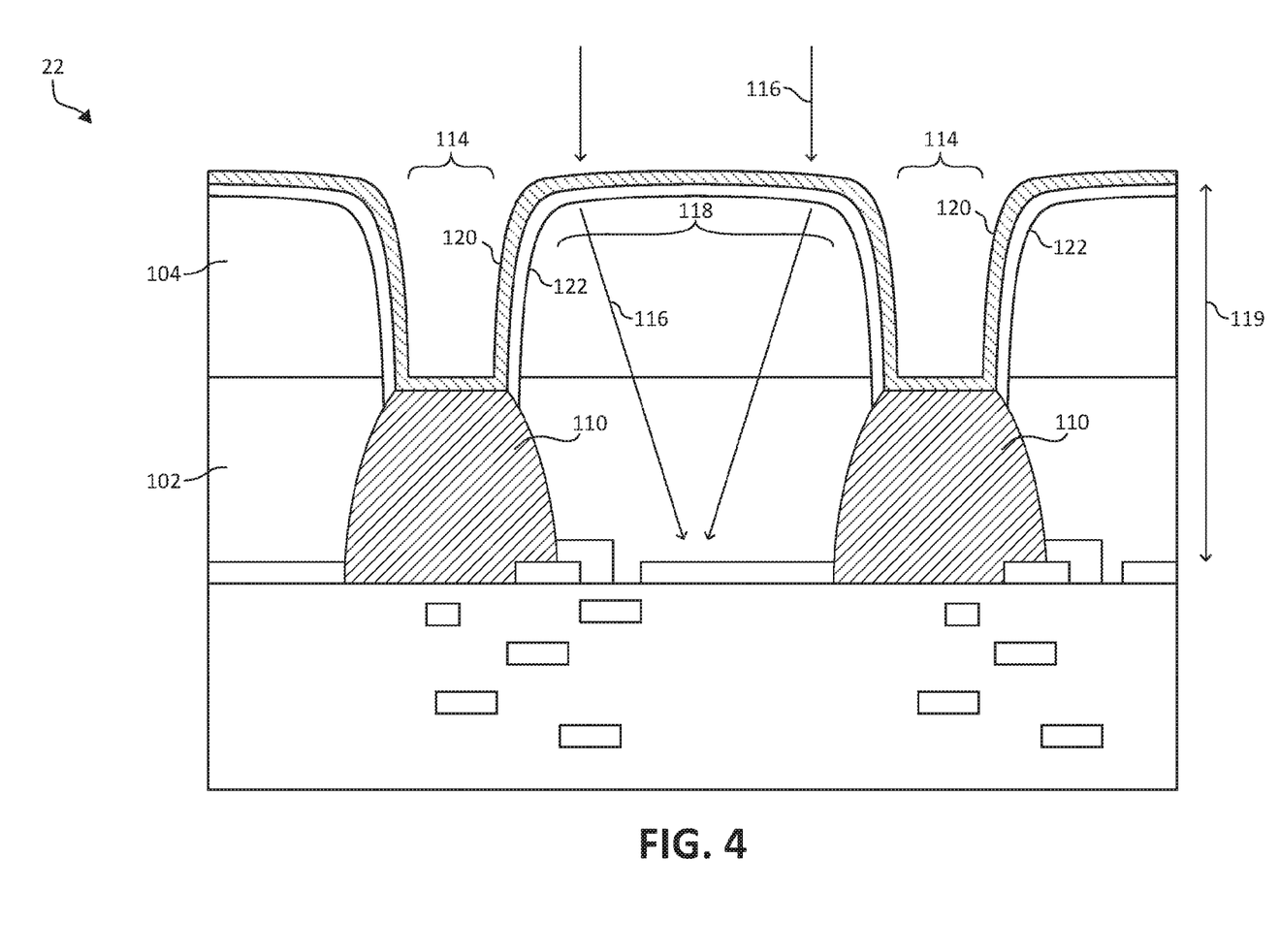
FIG. 4 is a cross-sectional side view of the illustrative imaging pixel of FIG. 3 after trenches and an inversion layer have been formed in accordance with an embodiment of the present invention.

FIG. 4 is a cross-sectional side view of the pixel of FIG. 3 after etching. As shown, etching may be performed to form trenches 114 that further isolate adjacent pixels from one another. The etching process may be a wet silicon etch. A wet silicon etching process may minimize silicon crystal damage and reduce dark current in the pixel. Layer 104 may be etched to form trenches that meet p-type isolation regions 110 to ensure that each photodiode 118 is sufficiently isolated from adjacent photodiodes. Reactive ion etching may be used instead of wet silicon etching to form trenches 114. However, reactive ion etching may damage the silicon more than the wet silicon etch and result in the pixel having greater dark current.

Etching layer 104 may also etch n-type epitaxial silicon 104 into a microlens. In other words, by etching the upper surface of n-type epitaxial silicon 104 to have curvature, the silicon layer can act as a microlens to focus light 116 at a focal point. Additionally, trenches 114 may be filled with a material that has a lower refractive index than silicon (e.g., air or silicon dioxide). Using this low refractive index material will result in a pixel microlens with high optical power.

Additionally, the silicon surface may be lined with a material or materials that inverts n-type to p-type. For example, inversion layer 122 may be a conductive or dielectric layer that inverts n-type to p-type. Inversion layer 122 may be, for example, hafnium oxide ($HfO_2$), a boron oxide, or any other desired material. Inversion layer 120 may be a conductive or dielectric layer that inverts n-type to p-type. Inversion layer 120 may be tantalum pentoxide ($Ta_2O_5$) or any other desired material. Layers 120 and 122 may additionally act as an antireflective coating. Alternatively, an additional antireflective coating may be provided. In other embodiments, only one inversion layer or three or more inversion layers may be provided.

After etching, photodiode 118 may have a photon collection depth 119. Depth 119 may be more than 1 micron, more than 2 microns, more than 5 microns, more than 8 microns, approximately 8 microns, between 5 and 10 microns, more than 10 microns, less than 10 microns, between 7 and 9 microns, or any other desired depth.

Figure 5:
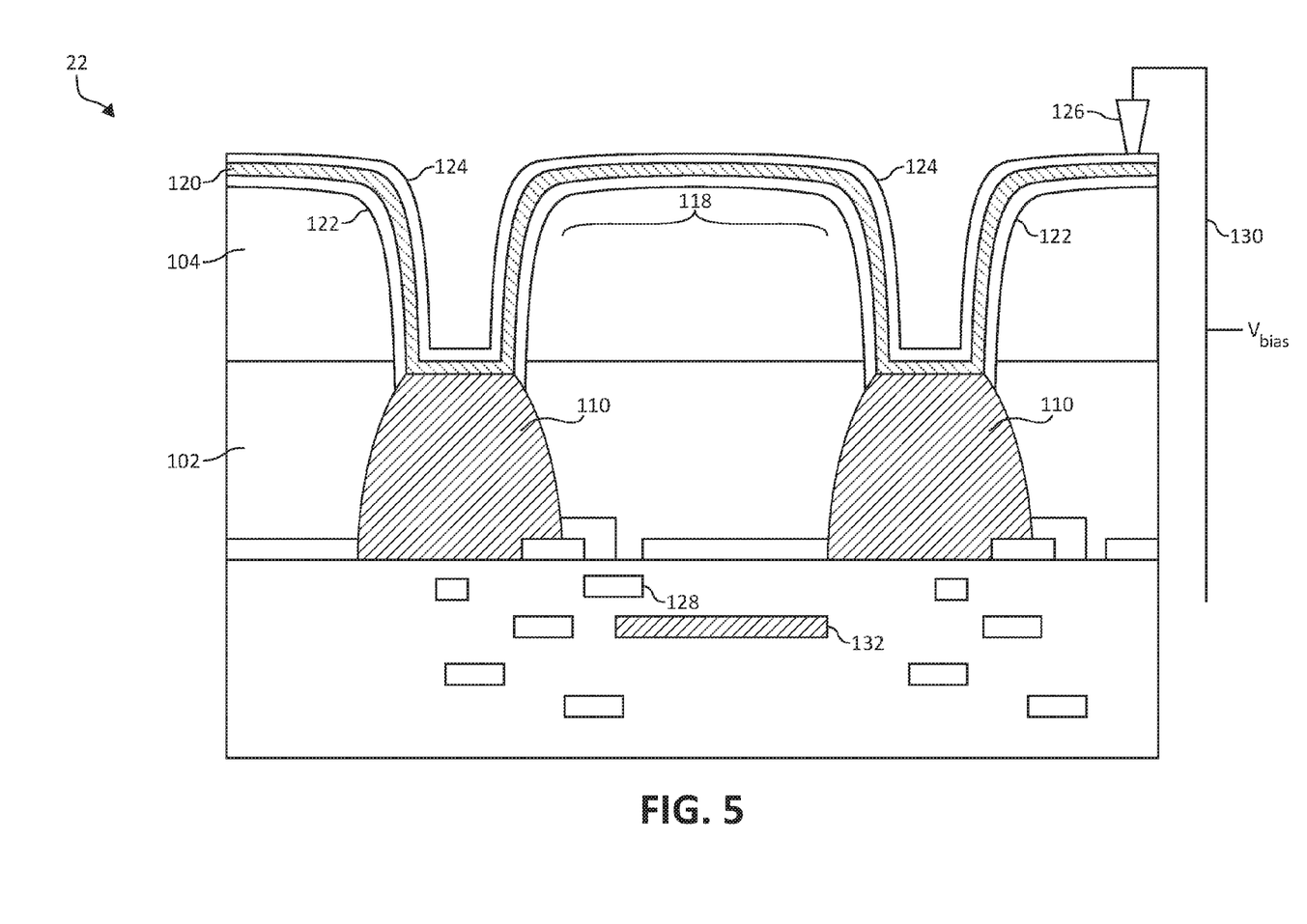
FIG. 5 is a cross-sectional side view of an illustrative imaging pixel with a conductive biasing layer formed over the back side and in back side trenches of the imaging pixel in accordance with an embodiment of the present invention.

FIG. 5 is a cross-sectional side view of an illustrative pixel with an additional conductive layer and a front side reflector. As shown, pixel 22 may include a thin layer of conductive material formed on top of layer 120. Conductive layer 124 may be formed over photodiode 118 such that incident light passes through conductive layer 124 to reach photodiode 118. Accordingly, conductive layer 124 may be substantially transparent to ensure accurate light sensing in photodiode 118. Conductive layer 124 may be formed from polysilicon, aluminum, tungsten, indium tin oxide (ITO), or any other desired material. Conductive layer 124 may be formed from conductive material meshes (e.g., a thin metal material with a pattern of holes) to ensure the conductive layer is transparent. If desired, different portions of conductive layer 124 may be formed from different materials. For example, the portion of conductive layer 124 in trenches 114 does not need to be transparent since it does not overlay photodiode 118. Accordingly, the portions of conductive layer 124 in trenches 114 may be formed from a non-transparent material while the portions of conductive layer 124 that are not formed in trenches 114 may be formed from a transparent material. In general, any combination of conductive materials may be used to form conductive layer 124.

Conductive layer 124 in trenches 114 may help isolate adjacent photodiodes. Additionally, conductive layer 124 may be coupled to contact 126 which is subject to an electric potential. The potential applied to contact 126 and conductive layer 124 may be varied during operation of the pixel to optimize pixel performance. For example, the potential on the contact may be negative during image acquisition to lower dark current. During readout, the potential may be pulsed more negative to push electrons towards transfer gate 128 for better charge transfer. This may improve the performance of pixel 22.

Contact 126 may be coupled to bias voltage supply line 130 which supplies a bias voltage ($V_{bias}$). During image acquisition, bias voltage supply line 130 may provide a first bias voltage to contact 126 and conductive layer 124. The first bias voltage may be a negative bias voltage. During readout, bias voltage supply line 130 may provide a second bias voltage to contact 126 and conductive layer 124. The second bias voltage may be a negative bias voltage that is less than (i.e., more negative than) the first bias voltage. The low bias voltage during readout may funnel electrons towards transfer gate 128. Conductive layer 124 may be held at the second bias voltage throughout readout. Alternatively, the bias voltage supply line may pulse the second bias voltage such that the conductive layer rapidly switches between the second bias voltage and the first bias voltage. Pulsing the bias voltage to a lower value in this manner may increase effectiveness of the conductive layer in funneling electrons to the transfer gate.

To further enhance performance, pixel 22 may include a front side reflector 132. Front side reflector 132 may be formed from a reflective material (e.g., metal). Reflector 132 may reflect photons that initially pass through photodiode 118 without being converted into electrical charge back into photodiode 118. Front side reflector 132 may increase the sensitivity and quantum efficiency of pixel 22 which has advantageous effects on pixel performance by detecting a larger percent of incident photons.

Figure 6:
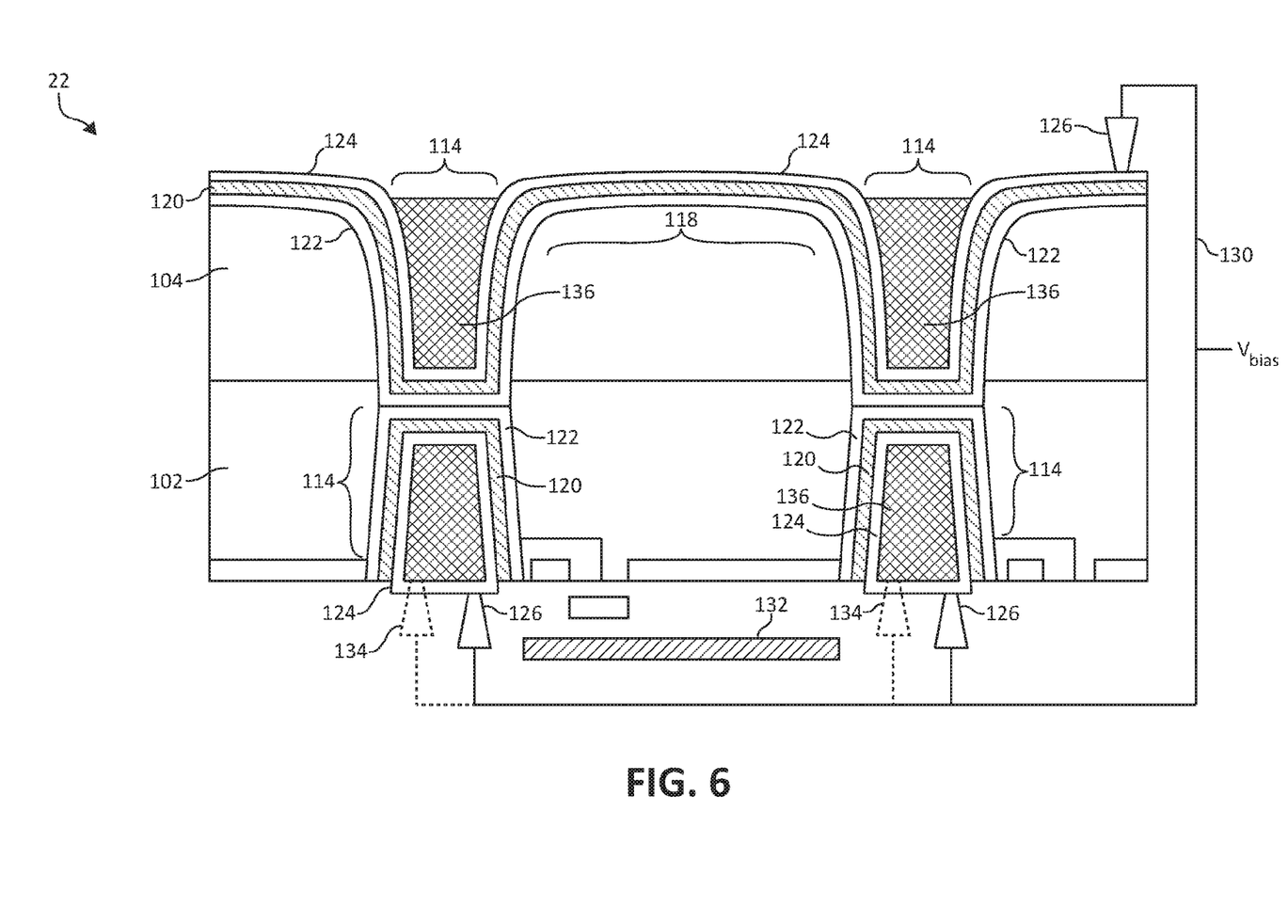
FIG. 6 is a cross-sectional side view of an illustrative imaging pixel with a conductive biasing layer formed on the back side of the imaging pixel and in front side and back side trenches in accordance with an embodiment of the present invention.

FIG. 6 is a cross-sectional side view of pixel 22 with trenches surrounding the pixel on all sides. Instead of a trench and a p-type isolation region combining to isolate the pixels (e.g., FIGS. 4 and 5), layers 102 and 104 may both have trenches that isolate the pixels. The trenches in layer 102 may be formed via etching in the same way as the trenches in layer 104. The trenches in layer 102 may also have inversion layers 122 and 120 for inverting n-type to p-type. The trenches in layer 102 may have conductive layer 124 similar to the conductive layer in layer 104. As shown in FIG. 6, conductive layer 124 may completely surround the trench in layer 102. In certain embodiments, as shown in FIG. 6, trenches 114 may be filled with an additional conductive material 136. Conductive material 136 may provide additional optical and electrical isolation for photodiodes 118. In certain embodiments, contacts 126 may be coupled to conductive layer 124 such that contact 126 directly contacts conductive layer 124. In other embodiments, contacts such as contacts 134 may be coupled to the trench fill material 136 such that the contacts directly couple conductive material 136.

Although the contacts in FIG. 6 are illustrated as all being coupled to bias voltage supply line 130, this example is merely illustrative. If desired, each contact may be coupled to an individual bias voltage supply line such that the bias voltage at each contact can be independently controlled.

Figure 7:
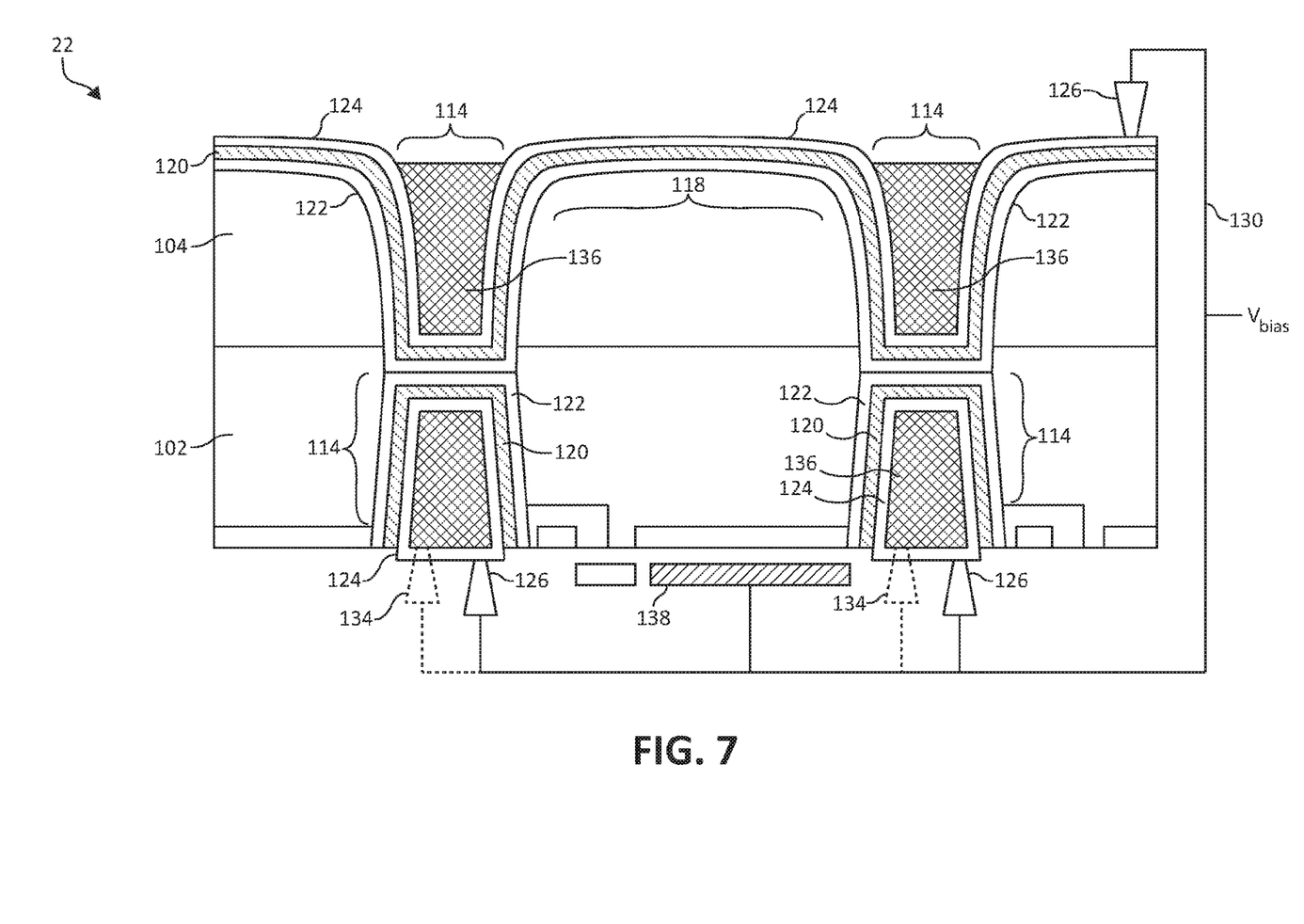
FIG. 7 is a cross-sectional side view of an illustrative imaging pixel with an additional biasing gate formed at the front side of the imaging pixel in accordance with an embodiment of the present invention.

FIG. 7 is a cross-sectional side view of an illustrative image pixel with an additional biasing layer. As shown in FIG. 7, layer 138 may be provided at the front side of the photodiode. Layer 138 may be coupled to bias voltage supply line 130 and may help reduce dark current in the pixel. Layer 138 may be formed from the same material as conductive layer 124 or a different material from conductive layer 124. In general, layer 138 may be formed from any desired conductive material (e.g., metal, polysilicon, etc.). It may be formed, for example, from the polysilicon together with trunk transistors 112. Layer 138 may be biased in the same way as contacts 126. Alternatively, layer 138 may be biased independently of the other contacts. For example, layer 138 may be biased at a higher voltage level than contacts 126 during pixel readout. Note that in FIGS. 6 and 7, various trunk transistors are not included in the drawings so as to not obfuscate the drawings.

Figure 8A:
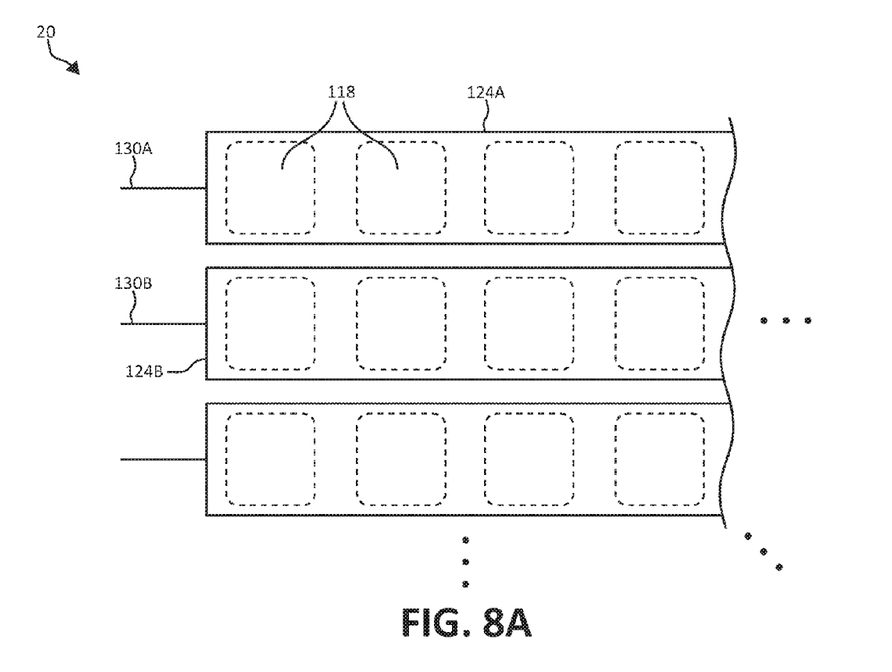
FIGS. 8A, 8B, and 8C are top views of an illustrative pixel array showing how biasing conductive layers may be formed over pixels in accordance with an embodiment of the present invention.
Figure 8B:
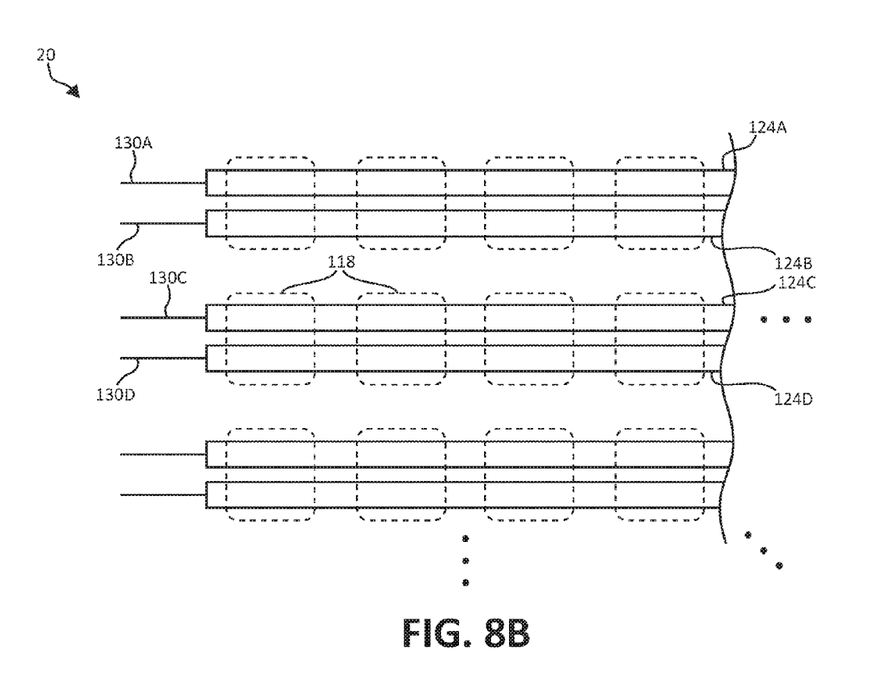
Figure 8C:
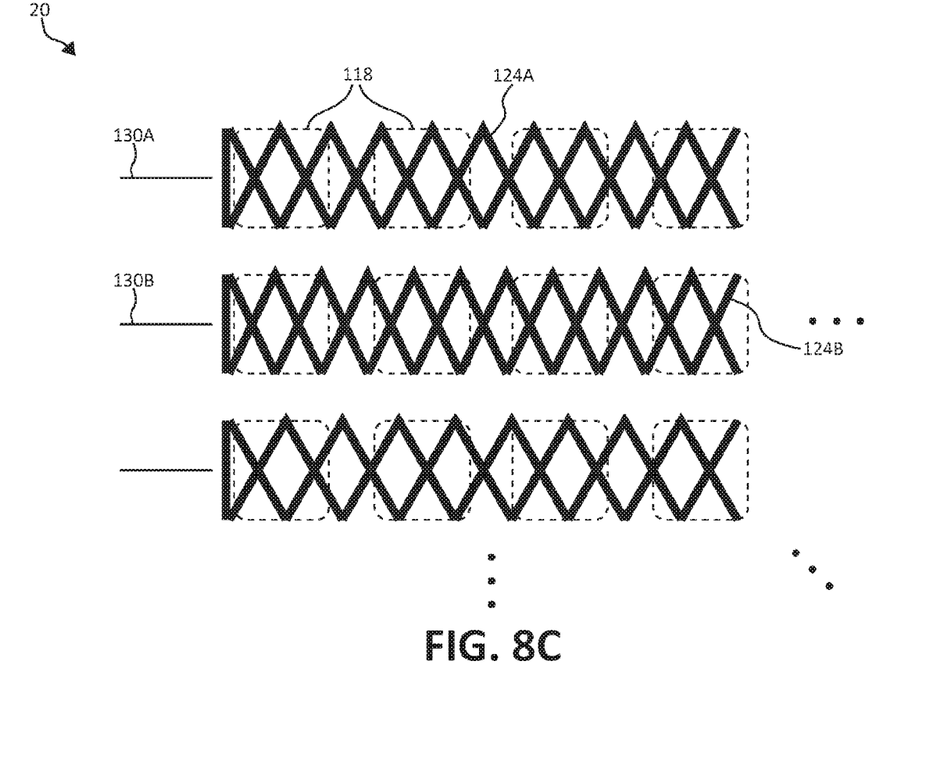

FIGS. 8A, 8B, and 8C show top views of an illustrative pixel array with pixels that include biasing conductive layers. As shown in FIG. 8A, each row of pixels (with photodiodes 118) may be covered by a corresponding conductive layer. In this embodiment, each row's conductive layer can be independently controlled. As shown, the pixels in the first row are covered by conductive layer 124A which is coupled to bias voltage supply line 130A. Similarly, the pixels in the second row are covered by conductive layer 124B which is coupled to bias voltage supply line 130B. During image acquisition, the bias voltage supply lines may default to supplying a first bias voltage. When a row is undergoing readout, that row's conductive layer may be biased to a second bias voltage while the remaining rows continue to supply the first bias voltage. The second bias voltage may be lower than the first bias voltage.

In FIG. 8B, each row has two independently controlled biasing layers. The pixels in the first row have two conductive layers 124A and 124B which are coupled to bias voltage supply lines 130A and 130B respectively. The pixels in the second row have two conductive layers 124C and 124D which are coupled to bias voltage supply lines 130C and 130D respectively.

In FIG. 8C, a mesh-like configuration of biasing layer per each pixel rows is shown that provides for better light transfer. Conductive mesh material may be thin metal or any other suitable conductive material such as polysilicon or indium tin oxide.

The illustrative examples shown in FIGS. 8A and 8B are merely a few of the many possible arrangements of conductive biasing layers in a pixel array. A single conductive layer may be used to bias a portion of a single pixel, a single pixel, multiple pixels in the same row, or multiple pixels in multiple rows. Each pixel may be biased by one conductive layer, two conductive layers, three conductive layers, or more than three conductive layers.

The use of conductive layers coupled to bias voltage supply lines has been described herein in the context of visual and near infrared pixels. However, biasing conductive layers of this kind are not limited to these pixels and may be used in any desired type of pixel. For example, the biasing conductive layers may be used in color light pixels. Color light pixels may have color filter elements such as blue color filter elements, red color filter elements, green color filter elements, yellow color filter elements, clear color filter elements, etc. In certain embodiments, the aforementioned biasing conductive layers may be used to adjust spectral response in visible light pixels. For example, a pixel array may be patterned with a Bayer color filter array such that there are red, green, and blue color filters. In this example, it is desirable for the red and green pixels to pass no blue light. However, some blue light may still pass through to the red and green pixels. A bias voltage may be applied to a conductive layer that covers the red and green pixels, which may reduce the amount of blue light collected by those pixels.

As described in the previous example, biasing conductive layers may be formed in any desired pattern over a pixel array. For example, a biasing conductive layer may only cover pixels of a certain color or colors. In general, any number of biasing conductive layers may be formed in any combination, pattern, or shape, depending on the specific design needs of the image sensor.

In various embodiments of the invention, an imaging pixel may include a substrate, a photodiode formed on the substrate, a conductive layer that covers the imaging pixel such that incident light passes through the conductive layer to reach the photodiode, and a bias voltage supply line that is coupled to the conductive layer and provides a bias voltage to the conductive layer. The conductive layer may include polysilicon, aluminum, tungsten, indium tin oxide, or a metal mesh. The imaging pixel may include doped silicon, and the doped silicon may be curved to form a microlens for the imaging pixel. The imaging pixel may also include at least one inversion layer formed on the doped silicon that is interposed between the doped silicon and the conductive layer. The at least one inversion layer may include a layer of hafnium oxide and/or a layer of tantalum pentoxide.

The imaging pixel may be a back side illuminated imaging pixel. The imaging pixel may also include a reflector formed on a front side of the imaging pixel. The conductive layer may be formed on a back side of the imaging pixel. The imaging pixel may also include an additional conductive layer formed on a front side of the imaging pixel. The additional conductive layer may be coupled to the bias voltage supply line. The conductive layer may be formed on a back side of the imaging pixel. The imaging pixel may also include an additional conductive layer formed on a front side of the imaging pixel. The additional conductive layer may be coupled to an additional bias voltage supply line that provides a different bias voltage than the bias voltage supply line. The bias voltage supply line may be configured to provide the bias voltage to the conductive layer during an image acquisition period. The bias voltage supply line may be configured to provide an additional bias voltage to the conductive layer during a readout period. The additional bias voltage may be lower than the bias voltage.

In various embodiments, an image sensor with an array of imaging pixels may include a doped silicon substrate, an implanted region formed on the doped silicon substrate, epitaxial silicon formed on the implanted region, a conductive layer formed over the epitaxial silicon such that incident light passes through the conductive layer to reach the epitaxial silicon, and a bias voltage supply line that is coupled to the conductive layer and provides a bias voltage to the conductive layer. The epitaxial silicon may have etched portions that form imaging trenches between each imaging pixel in the array of imaging pixels. The image sensor may also include doped isolation regions formed in the implanted region. The doped isolation regions may be formed between each imaging pixel in the array of imaging pixels such that the trenches in the epitaxial silicon overlap the doped isolation regions. The implanted region may have etched portions that form additional trenches between each imaging pixel in the array of imaging pixels such that the trenches in the epitaxial silicon overlap the additional trenches.

The image sensor may also include an inversion layer interposed between the conductive layer and the epitaxial silicon. The array of imaging pixels may include a first row of imaging pixels, and the conductive layer may only cover the first row of imaging pixels. The array of imaging pixels may include a first row of imaging pixels and an additional plurality of rows of imaging pixels. The conductive layer may cover the first row of imaging pixels, and the image sensor may also include a plurality of additional conductive layers and a plurality of additional bias voltage supply lines. Each conductive layer of the plurality of additional conductive layers may cover a respective row of imaging pixels of the additional plurality of rows of imaging pixels, and each bias voltage supply line of the plurality of additional bias voltage supply lines may be coupled to a respective conductive layer of the plurality of additional conductive layers.

In various embodiments, a method of operating an imaging pixel with a photodiode, a conductive layer that covers the imaging pixel such that incident light passes through the conductive layer to reach the photodiode, and a bias voltage supply line may include using the bias voltage supply line to supply a first bias voltage to the conductive layer during a first time period, and using the bias voltage supply line to supply a second bias voltage to the conductive layer during a second time period. The second bias voltage may be different than the first bias voltage. The second bias voltage may be lower than the first bias voltage. The first time period may include an image acquisition period during which the photodiode collects charge, and the second time period may include a readout period during which the charge is transferred out of the photodiode using a transfer gate.

The foregoing is merely illustrative of the principles of this invention and various modifications can be made by those skilled in the art without departing from the scope and spirit of the invention.

What is claimed is:

1. An imaging pixel comprising:
   a substrate;
   a photodiode formed on the substrate;
   a conductive layer that covers the imaging pixel such that incident light passes through the conductive layer to reach the photodiode; and
   a bias voltage supply line that is coupled to the conductive layer and provides a bias voltage to the conductive layer, wherein the bias voltage supply line is configured to provide the bias voltage to the conductive layer during an image acquisition period, wherein the bias voltage supply line is configured to provide an additional bias voltage to the conductive layer during a readout period, and wherein the additional bias voltage is lower than the bias voltage.

2. The imaging pixel defined in claim 1, wherein the imaging pixel is a back side illuminated imaging pixel, the imaging pixel further comprising:
   a reflector formed on a front side of the imaging pixel.

3. The imaging pixel defined in claim 1, wherein the conductive layer is formed on a back side of the imaging pixel, the imaging pixel further comprising:
   an additional conductive layer formed on a front side of the imaging pixel, wherein the additional conductive layer is coupled to the bias voltage supply line.

4. The imaging pixel defined in claim 1, wherein the conductive layer is formed on a back side of the imaging pixel, the imaging pixel further comprising:
   an additional conductive layer formed on a front side of the imaging pixel, wherein the additional conductive layer is coupled to an additional bias voltage supply line that provides a different bias voltage than the bias voltage supply line.

5. The imaging pixel defined in claim 1, wherein the imaging pixel includes doped silicon, and wherein the doped silicon is curved to form a microlens for the imaging pixel.

6. The imaging pixel defined in claim 1, wherein the conductive layer comprises a material selected from the group consisting of: polysilicon, aluminum, tungsten, indium tin oxide, and metal mesh.

7. An imaging pixel comprising:
   a substrate;
   a photodiode formed on the substrate;

a conductive layer that covers the imaging pixel such that incident light passes through the conductive layer to reach the photodiode; and
a bias voltage supply line that is coupled to the conductive layer and provides a bias voltage to the conductive layer, wherein the imaging pixel includes doped silicon, and wherein the doped silicon is curved to form a microlens for the imaging pixel.

8. The imaging pixel defined in claim 7, further comprising:
at least one inversion layer formed on the doped silicon that is interposed between the doped silicon and the conductive layer.

9. The imaging pixel defined in claim 8, wherein the at least one inversion layer comprises at least one layer selected from the group consisting of: a hafnium oxide layer and tantalum pentoxide layer.

10. The imaging pixel defined in claim 7, wherein the bias voltage supply line is configured to provide the bias voltage to the conductive layer during an image acquisition period, wherein the bias voltage supply line is configured to provide an additional bias voltage to the conductive layer during a readout period, and wherein the additional bias voltage is lower than the bias voltage.

11. The imaging pixel defined in claim 7, wherein the conductive layer comprises a material selected from the group consisting of: polysilicon, aluminum, tungsten, indium tin oxide, and metal mesh.

12. An image sensor with an array of imaging pixels, the image sensor comprising:
a doped silicon substrate;
an implanted region formed on the doped silicon substrate;
epitaxial silicon formed on the implanted region, wherein the epitaxial silicon has etched portions that form trenches between each imaging pixel in the array of imaging pixels;
a conductive layer formed over the epitaxial silicon such that incident light passes through the conductive layer to reach the epitaxial silicon; and
a bias voltage supply line that is coupled to the conductive layer and provides a bias voltage to the conductive layer.

13. The image sensor defined in claim 12, further comprising:
doped isolation regions formed in the implanted region, wherein the doped isolation regions are formed between each imaging pixel in the array of imaging pixels such that the trenches in the epitaxial silicon overlap the doped isolation regions.

14. The image sensor defined in claim 12, wherein the implanted region has etched portions that form additional trenches between each imaging pixel in the array of imaging pixels such that the trenches in the epitaxial silicon overlap the additional trenches.

15. The image sensor defined in claim 12, further comprising:
an inversion layer interposed between the conductive layer and the epitaxial silicon.

16. The image sensor defined in claim 12, wherein the array of imaging pixels comprises a first row of imaging pixels, and wherein the conductive layer only covers the first row of imaging pixels.

17. The image sensor defined in claim 12, wherein the array of imaging pixels comprises a first row of imaging pixels and an additional plurality of rows of imaging pixels, wherein the conductive layer covers the first row of imaging pixels, wherein the image sensor further comprises:
a plurality of additional conductive layers, wherein each conductive layer of the plurality of additional conductive layers covers a respective row of imaging pixels of the additional plurality of rows of imaging pixels; and
a plurality of additional bias voltage supply lines, wherein each bias voltage supply line of the plurality of additional bias voltage supply lines is coupled to a respective conductive layer of the plurality of additional conductive layers.

\* \* \* \* \*